(12) United States Patent
Kim et al.

(10) Patent No.: US 11,702,737 B2
(45) Date of Patent: Jul. 18, 2023

(54) BATCH-TYPE SUBSTRATE PROCESSING APPARATUS AND OPERATION METHOD THEREOF

(71) Applicant: EUGENE TECHNOLOGY CO., LTD., Yongin-Si (KR)

(72) Inventors: Hee Seok Kim, Seongnam-Si (KR); Kyu Jin Choi, Seongnam-Si (KR); Kang Il Lee, Yongin-Si (KR)

(73) Assignee: EUGENE TECHNOLOGY CO., LTD.

( * ) Notice: Subject to any disclaimer, the term of this patent is extended or adjusted under 35 U.S.C. 154(b) by 423 days.

(21) Appl. No.: 16/908,716

(22) Filed: Jun. 22, 2020

(65) Prior Publication Data

US 2021/0017644 A1     Jan. 21, 2021

(30) Foreign Application Priority Data

Jul. 16, 2019    (KR) .......................... 10-2019-0085807

(51) Int. Cl.
     *C23C 16/44*      (2006.01)
     *H01L 21/768*      (2006.01)

(52) U.S. Cl.
     CPC .... *C23C 16/4404* (2013.01); *H01L 21/76841* (2013.01)

(58) Field of Classification Search
     CPC ............ C23C 16/4401; C23C 26/4404; C23C 16/4481; C23C 16/45544; C23C 16/4587
     See application file for complete search history.

(56) References Cited

U.S. PATENT DOCUMENTS

| 2006/0084201 A1 | 4/2006 | Hasper et al. |
| 2009/0114156 A1* | 5/2009 | Nodera ................. C23C 16/345 |
| | | 118/725 |
| 2014/0318457 A1* | 10/2014 | Umezawa ........... C23C 16/4408 |
| | | 118/725 |

FOREIGN PATENT DOCUMENTS

| JP | H07263370 A | 10/1995 |
| JP | 2001226773 A | 8/2001 |
| JP | 2002001865 A | 1/2002 |
| JP | 2007317704 A | 12/2007 |
| JP | 2008140864 A | 6/2008 |
| JP | 2010280945 A | 12/2010 |
| JP | 2014075451 A | 4/2014 |
| JP | 2015103652 A | 6/2015 |
| JP | 6026351 B2 | 11/2016 |

(Continued)

OTHER PUBLICATIONS

Hahn, Jun-Hee et al., "Nanoindentation Experiments on MEMS Device", Journal of the Korean Ceramic Society, vol. 40 Issue 7, pp. 657-661, 2003.

*Primary Examiner* — Brook Kebede
(74) *Attorney, Agent, or Firm* — Renaissance IP Law Group LLP (57) ABSTRACT

Provided is a batch-type substrate processing apparatus. The substrate processing apparatus includes a vertical reaction tube having an internal space for receiving a substrate boat in which a substrate is stacked in multiple stages, a deposition gas supply unit configured to supply a deposition gas inside the reaction tube, a heater disposed outside the reaction tube to provide a thermal energy inside the reaction tube, and an adhesion layer coated on an inner wall of the reaction tube and to which a deposition by-product layer by an excess deposition gas is attached.

9 Claims, 2 Drawing Sheets

(56) References Cited

FOREIGN PATENT DOCUMENTS

| KR | 100805781 B1 | 2/2008 |
| KR | 20100095398 A | 8/2010 |
| KR | 20120085906 A | 8/2012 |
| WO | 2012090738 A1 | 7/2012 |

* cited by examiner

FIG. 3

BATCH-TYPE SUBSTRATE PROCESSING APPARATUS AND OPERATION METHOD THEREOF

CROSS-REFERENCE TO RELATED APPLICATION

This application claims priority to Korean Patent Application No. 10-2019-0085807 filed on Jul. 16, 2019, and all the benefits accruing therefrom under 35 U.S.C. § 119, the contents of which are incorporated by reference in their entirety.

BACKGROUND

The present invention relates to a batch-type substrate processing apparatus and its operating method, and more particularly, to a batch-type substrate processing apparatus and its operating method that can increase the in-situ cleaning cycle of the reaction tube.

When a thin film is deposited on a multi-stage wafer in a batch-type substrate processing apparatus, a thin film by-product layer is formed not only on the substrate, but also on the inner wall of a vertical reaction tube exposed to deposition gas. A thin film is deposited on the substrate only once with a certain thickness, but a by-product layer accumulates and adheres (or deposits) to the inner wall of the reaction tube whenever a new substrate is loaded. In such a way, the by-product layer attached to the inner wall of the reaction tube is exposed to continuous heat change and cracks and/or delamination occurs in the by-product layer due to thermal stress so that small particles in the by-product layer fall off the inner wall of the reaction tube. When the small particles of the by-product layer fall on the substrate, this can act as a particle and degrade the properties and/or yield of products including thin films.

In particular, in a typical reaction tube made of quartz, it becomes more problematic when the reaction tube serves as a diffusion barrier in a metal layer for wiring or an integrated circuit (IC) or a nitride (for example, TiN, TaN, etc.) thin film used as an adhesive layer is deposited between the base metal and the metal. In this case, a heterogeneous by-product layer such as metal or nitride adheres to the inner wall surface of the reaction tube made of oxide quartz ($SiO_2$), and the heterogeneous by-product layer is easily peeled off or cracks are generated.

SUMMARY

The present disclosure provides a batch-type substrate processing apparatus and an operation method of the same capable of increasing an in-situ cleaning cycle of a reaction tube that removes a deposition by-product layer attached to the inner wall of the reaction tube.

In accordance with an exemplary embodiment, a batch-type substrate processing apparatus includes: a vertical reaction tube having an internal space for receiving a substrate boat in which a substrate is stacked in multiple stages; a deposition gas supply unit configured to supply a deposition gas inside the reaction tube; a heater disposed outside the reaction tube to provide a thermal energy inside the reaction tube; and an adhesion layer coated on an inner wall of the reaction tube and to which a deposition by-product layer by an excess deposition gas is attached.

The adhesion layer may have a coefficient of thermal expansion between a coefficient of thermal expansion of the reaction tube and a coefficient of thermal expansion of the deposition by-product layer.

A difference of the coefficient of thermal expansion of the adhesion layer and the coefficient of thermal expansion of the deposition by-product layer may be smaller than a difference of the coefficient of thermal expansion of the adhesion layer and the coefficient of thermal expansion of the reaction tube.

The adhesion layer may have an elastic modulus lower than the deposition by-product layer.

The reaction tube may be made of quartz, wherein the deposition by-product layer may be a nitride layer, wherein the adhesion layer may include: an oxide layer formed in contact with the reaction tube; and an oxynitride layer formed on the oxide layer to provide an attachment surface of the deposition by-product layer.

The oxide layer and the oxynitride layer of the adhesion layer may include the same metal element.

The deposition by-product layer may include a transition metal element, and wherein the adhesion layer may include a post-transition metal element.

The substrate processing apparatus may further include a cleaning gas supply unit configured to supply a cleaning gas for removing the deposition by-product layer, and wherein the adhesion layer may have a higher corrosion resistance to the cleaning gas than the reaction tube.

The adhesion layer may have a thickness of 0.1 µm to 100 µm.

In accordance with another exemplary embodiment, an operation method of a batch-type substrate processing apparatus may include: preparing a vertical reaction tube coated with an adhesion layer on an inner wall; performing a deposition process for a substrate loaded in multiple stages on a substrate boat by supplying a deposition gas to an interior space of the reaction tube; attaching a deposition by-product layer by an excess deposition gas to the adhesion layer; checking an attachment thickness of the deposition by-product layer; and removing the deposition by-product layer when the measured attachment thickness of the deposition by-product layer is greater than or equal to a preset thickness.

The reaction tube may be made of quartz, wherein the deposition by-product layer may be a nitride layer, wherein the preparing of the reaction tube may include: forming an oxide layer on an inner wall of the reaction tube; and forming an oxynitride layer on the oxide layer.

The thickness of the adhesion layer may be 0.1 µm to 100 µm, and wherein the removing of the deposition by-product layer may be performed when the attachment thickness of the deposition by-product layer is 303 nm or more.

The method may further include providing a heat energy to an interior of the reaction tube, and wherein the adhesion layer may have a coefficient of thermal expansion between a coefficient of thermal expansion of the reaction tube and a coefficient of thermal expansion of the deposition by-product layer.

The adhesion layer may have an elastic modulus lower than the deposition by-product layer.

The removing of the deposition by-product layer may include supplying a cleaning gas for removing the deposition by-product layer, and wherein the adhesion layer may have a higher corrosion resistance to the cleaning gas than the reaction tube.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, embodiments of the present invention will be described in detail with reference to the accompanying drawings. However, the present invention may be embodied in different forms and should not be construed as limited to the embodiments set forth herein, and rather, these embodiments are provided so that this disclosure will be thorough and complete, and will fully convey the scope of the present invention to those skilled in the art. In the description, the same components are denoted by the same reference numerals, and the drawings are partially exaggerated in size to accurately describe the embodiments of the present invention, and like reference numerals refer to like elements in the drawings.

Figure 1:
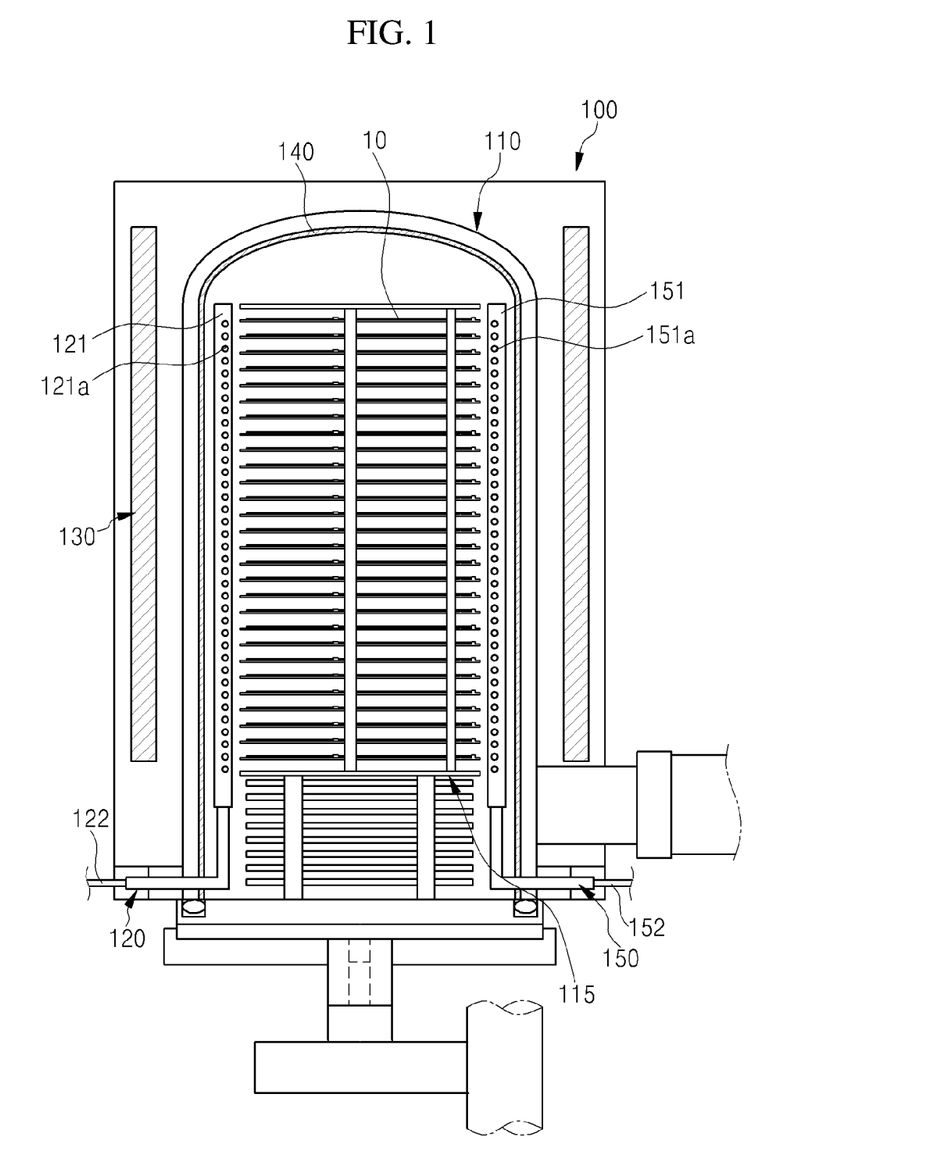
FIG. 1 is a cross-sectional view showing a batch-type substrate processing apparatus according to an embodiment of the present invention.

FIG. 1 is a cross-sectional view showing a batch-type substrate processing apparatus according to an embodiment of the present invention.

Referring to FIG. 1, a batch-type substrate processing apparatus 100 according to an embodiment of the present invention may include a vertical reaction tube 110 having an internal space for receiving the substrate boat 115 on which the substrate 10 is stacked in multiple stages; a deposition gas supply unit 120 for supplying deposition gas inside the reaction tube 110; a heater 130 disposed outside the reaction tube 110 to provide heat energy inside the reaction tube 110; and an adhesion layer 140 coated on the inner wall of the reaction tube 110 to which a deposition by-product layer 15 is attached by excess deposition gas.

The reaction tube 110 may have an internal space accommodating the substrate boat 115 on which the substrate 10 is stacked in multiple stages, and may be formed in a vertical type. Here, the substrate boat 115 may be stacked in multiple stages (or vertically) in order to perform a deposition process for the substrate 10 in a batch-type. And the substrate boat 115 may be accommodated in the interior space (or process space) of the reaction tube 110 for the deposition process for the substrate 10. In the interior space of the reaction tube 110, the substrate boat 115 may be accommodated during the deposition process for the substrate 10, and a thin film may be deposited on the substrate 10 loaded on the substrate boat 115. At this time, the reaction tube 110 may be made of a single tube, or may be made of a plurality of tubes, and it is sufficient if the substrate boat 115 can be accommodated to provide a process space in which a deposition process for the substrate 10 can be performed. For example, the reaction tube 110 may be composed of an outer tube and an inner tube, and in such a case, an adhesion layer 140 may be coated on the inner wall of the inner tube.

The deposition gas supply unit 120 may supply deposition gas inside the reaction tube 110. Here, the deposition gas supply unit 120 may include a deposition gas nozzle 121, a deposition gas supply pipe 122 and a deposition gas supply source (not shown). The deposition gas nozzle 121 may be inserted into the reaction tube 110 and may extend vertically along the inner circumferential surface of the reaction tube 110, and may be configured to supply deposition gas to the substrate 10 from a plurality of gas injection ports 121a formed toward the inside. At this time, the deposition gas nozzle 121 may be composed of quartz. The deposition gas may be supplied with a gas required for thin film deposition (or film formation), and a plurality of gases that react with each other to produce a reaction product may be supplied. When a plurality of gases are supplied to the deposition gas, a plurality of deposition gas nozzles may be provided. For example, the deposition gas may be used as a combination of a raw material gas such as a silicon-containing gas or an organic metal-containing gas and an oxidizing gas oxidizing the raw material gas or a nitriding gas nitriding the raw material gas.

The deposition gas supply pipe 122 may deliver (or supply) the deposition gas to the deposition gas nozzle 121, and one end may be connected to the deposition gas nozzle 121, and the other end may be connected to a deposition gas source (not shown).

The deposition gas supply source (not shown) may be a gas storage source for supplying the deposition gas to the deposition gas nozzle 121. Here, the deposition gas supply source (not shown) can supply various deposition gases to the deposition gas nozzle 121 according to the application, and can supply the deposition gas to the deposition gas nozzle 121 through the deposition gas supply pipe 122.

The heater 130 may disposed outside the reaction tube 110, and may provide thermal energy inside the reaction tube 110, and may allow the interior of the reaction tube 110 to be heated, and may perform heat treatment of the substrate 10. The heater 130 may be provided along the circumference of the reaction tube 110 on the outside of the reaction tube 110, and may supply heat to the inside of the reaction tube 110 through the side wall of the reaction tube 110 from the outside of the reaction tube 110. For example, the heater 130 may be formed of a round (e.g., cylindrical) heat insulating member and a heating element provided on the inner circumference (surface) of the heat insulating member, and may be configured to be divided into a plurality of zones in a height direction to enable temperature control.

Figure 2:
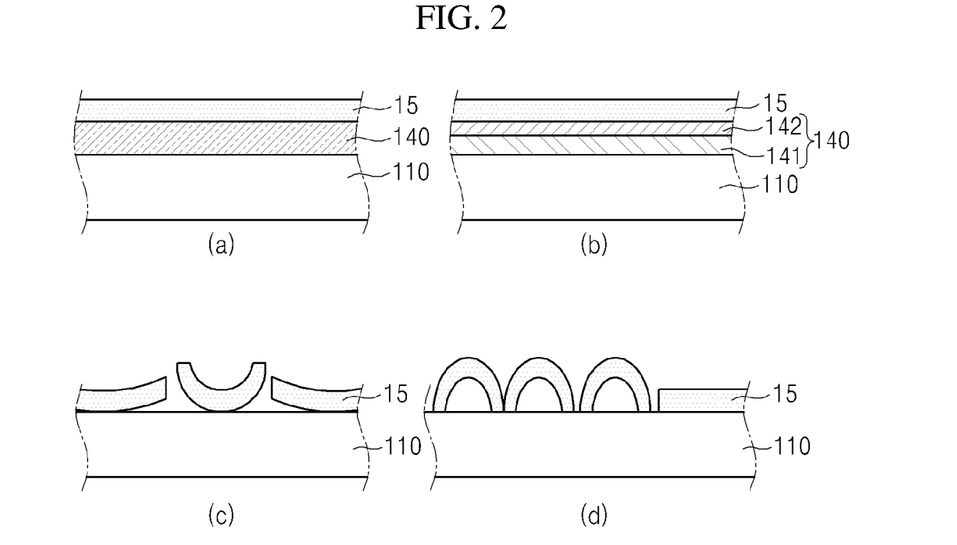
FIG. 2 is a conceptual diagram for explaining the bonding of the adhesion layer and the deposition by-product layer according to an embodiment of the present invention.

FIG. 2 is a conceptual diagram for explaining the bonding of the adhesion layer and the deposition by-product layer according to an embodiment of the present invention. (a) of FIG. 2 shows a single layer of adhesion layer. (b) of FIG. 2 shows an adhesion layer consisting of a plurality of layers. (c) of FIG. 2 shows delamination by tension. (d) of FIG. 2 shows delamination by compression.

Referring to FIGS. 1 and 2, the adhesion layer 140 is coated on the inner wall of the reaction tube 110, and the deposition by-product layer 15 by the remaining deposition gas after depositing on the substrate 10 may be attached (or deposited) to the adhesion layer 140. When performing a deposition process for the substrate 10 through the deposition gas, the deposition by-product layer 15 may be attached to the inner wall of the reaction tube 110 exposed to the excess deposition gas as well as the substrate 10. The thin film formed by the deposition gas is deposited on the substrate 10, only once with a specific thickness, but whenever a new substrate 10 is loaded on the inner wall of the reaction tube 110, the deposition by-product layer 15 accumulates and adheres. Thus, the deposition by-product layer 15 attached to the inner wall of the reaction tube 10 has no choice but to be exposed to continuous heat changes due to the heat treatment of the substrate 10 for thin film deposition and cooling of the reaction tube 110 for the removal of the substrate 10. Accordingly, cracks and/or delamination occurs in the deposition by-product layer 15 due to thermal stress so that small particles of the delamination deposited by-product layer 15 fall off the inner wall of the reaction tube 110. When the small particles of the by-product layer 15 fall on the substrate 10, this can act as a particle and degrade the properties and/or yield of products including thin films. Here, cracks may be caused by tensile stress, and cracks may occur in the deposition by-product layer 15 so flake-off may occur, and interlayer delamination may occur without cracking due to compressive stress.

In particular, the titanium nitride (TiN) thin film, which serves as a diffusion barrier in an integrated circuit (IC), or is used as a glue layer between a base metal (e.g., silicon) and a metal (e.g., tungsten), has a very high intrinsic stress. When it is attached to the surface of the inner wall of the reaction tube made of quartz, because of the large difference in coefficient of thermal expansion from quartz, it is vulnerable to thermal stress. Eventually, the titanium nitride (TiN) thin film attached to the inner wall surface of the reaction tube not only has intrinsic stress but also thermal stress due to thermal change during deposition of titanium nitride (TiN) thin film so that it can easily fall off the inner wall surface of the reaction tube and act as a particle. Such particles may decrease the yield of the substrate processing apparatus, and in order to prevent particle generation, an in-situ cleaning cycle may be shortened, which may greatly affect productivity.

In addition, the batch-type substrate processing apparatus 100 for performing a deposition process by loading the substrate 10 in multiple stages on the substrate boat 115 sprays the deposition gas in a direction parallel to the deposition surface of the substrate 10 to deposit a thin film on the deposition surface of the substrate 10 through the flow of the deposition gas (e.g., laminar flow). For this reason, there is no choice but to supply more deposition gas compared to the sheet-fed substrate processing apparatus that directly sprays the deposition gas toward the deposition surface of the substrate 10 in a direction perpendicular to the deposition surface of the substrate 10. Accordingly, a relatively large amount of deposition gas is also increased, so that the deposition by-product layer 15 is thickly attached to the inner wall of the reaction tube 110. As a result, it is more problematic because particles are likely to occur.

The adhesion layer 140 improves the bonding force (or adhesive force) of the deposition by-product layer 15 to that of the deposition by-product layer 15 and the reaction tube 110 so that compared to when the deposition by-product layer 15 is directly attached to the inner wall surface of the reaction tube 110, the deposition thickness of the deposition by-product layer 15 where particles begin to be generated may increase. Accordingly, the in-situ cleaning cycle of the reaction tube 110 can be increased and a large number of deposition processes can be performed without removing (or cleaning) the process of removing the deposition by-product layer 15 so that product productivity can be increased.

That is, whenever the process of removing the deposition by-product layer 15 is performed, in addition to the time required to remove the deposition by-product layer 15, it takes a long time until the reaction tube 110 is made in a state (or condition) in which the deposition process can be performed again. Therefore, by reducing the number of processes to remove the deposition by-product layer 15, it is possible to improve product productivity. In addition, the cleaning gas removing the deposition by-product layer 15 and the exhaust gas produced by removing the deposition by-product layer (15) by the cleaning gas can be a source of pollution (or environmental pollution), and if the number of processes for removing the deposition by-product layer 15 is reduced, it may be reduced.

Here, the adhesion layer 140 may have a coefficient of thermal expansion between the coefficient of thermal expansion of the reaction tube 110 and the coefficient of thermal expansion of the deposition by-product layer 15. The thermal stress received by the deposition by-product layer 15 attached on the inner wall of the reaction tube 110 is generated in proportion to the difference in the coefficient of thermal expansion from the substrate (or the structure providing the attachment surface) to which the deposition by-product layer 15 is attached. Accordingly, the adhesion layer 140 having a coefficient of thermal expansion between the coefficient of thermal expansion of the reaction tube 110 and the coefficient of thermal expansion of the deposition by-product layer 15 reduces the difference in the coefficient of thermal expansion from the deposition by-product layer 15 so that it is possible to reduce the thermal stress received by the deposition by-product layer 15.

For example, the coefficient of thermal expansion of titanium nitride (TiN) (about $9.4 \times 10^{-6} K^{-1}$) is significantly different from the coefficient of thermal expansion (about $0.4 \times 10^{-6} K^{-1}$) of quartz ($SiO_2$), which is commonly used in the reaction tube 110. Accordingly, when the titanium nitride (TiN) deposition by-product layer 15 is directly attached to the inner wall surface of the reaction tube 110 made of quartz ($SiO_2$), particles start to develop at an adhesion thickness of 0.3 μm or more. However, when coating the adhesion layer 140 on the inner wall of the reaction tube 110 with aluminum oxide ($Al_xO_y$) such as alumina ($Al_2O_3$), the coefficient of thermal expansion of alumina ($Al_2O_3$) is about $8.3 \times 10^{-6} K^{-1}$, which can reduce the difference in the coefficient of thermal expansion from titanium nitride (TiN) deposition by-product layer 15 so that the deposition thickness of the deposition by-product layer 15 where particles start to be generated can be increased to a thickness greater than 0.3 μm. At this time, the deposition thickness of the deposition by-product layer 15 to generate particles may increase to about 3 μm or more. Accordingly, the in-situ cleaning cycle of the reaction tube 110 can be increased.

At this time, the difference of the coefficient of thermal expansion of the adhesion layer 140 and the coefficient of thermal expansion of the deposition by-product layer 15 may be smaller than the difference of the coefficient of thermal expansion of the adhesion layer 140 and the coefficient of thermal expansion of the reaction tube 110. Since the deposition by-product layer 15 is attached to the inner wall of the reaction tube 110 incidentally while depositing a thin film on the substrate 10, the adhesive force (or bonding force) is inevitably decreased, and it is insensitive to thermal stress due to the difference in the coefficient of thermal expansion. On the other hand, since the adhesion layer 140 is directly deposited on the inner wall of the reaction tube 110, the bonding force with the reaction tube 110 can be excellent, and accordingly, the influence of thermal stress due to the difference in the coefficient of thermal expansion can be reduced. Due to this, even if the adhesion layer 140 has a difference in the coefficient of thermal expansion from the reaction tube 110 to some extent and even if it is greater than the difference of the coefficient of thermal expansion of the adhesion layer 140 and the coefficient of thermal expansion of the deposition by-product layer 15, cracks and delamination of the deposition by-product layer 15 and the adhesion layer 140 may not occur.

For example, the deposition by-product layer 15 is attached by the excess deposition gas that is deposited on the substrate 10 and remains among the deposition gas injected toward the substrate 10, and the adhesion layer 140 may be deposited (or coated) by a coating gas sprayed toward the inner wall of the reaction tube 110. That is, since the adhesion layer 140 is deposited directly on the inner wall of the reaction tube 110 by spraying the coating gas toward the inner wall of the reaction tube 110, it can be uniformly deposited on the entire surface of the inner wall of the reaction tube 110 with a sufficient thickness at which coalescence occurs. Accordingly, the intrinsic stress of the adhesion layer 140 may be reduced, and the bonding force with the reaction tube 110 may be improved, and the influence of thermal stress due to a difference in the coefficient of thermal expansion with the reaction tube 110 may be reduced.

On the other hand, since the material of the reaction tube 110 is determined, and the deposition by-product layer 15 is determined according to the type of thin film to be deposited, it is difficult to change, and the adhesion layer 140 can be easily changed because only the desired material (or substance) needs to be coated on the inner wall of the reaction tube 110. Accordingly, the adhesion layer 140 of a suitable material may be coated on the inner wall of the reaction tube 110 in consideration of the material of the reaction tube 110 according to the type of thin film to be deposited. And, a material having an excellent adhesion with the reaction tube 110 and having a coefficient of thermal expansion similar to that of the deposition by-product layer 15 among the coefficient of thermal expansions between the coefficient of thermal expansion of the reaction tube 110 and the coefficient of thermal expansion of the deposition by-product layer 15 may coat the adhesion layer 140 on the inner wall of the reaction tube 110.

Accordingly, by reducing the difference of the coefficient of thermal expansion of the adhesion layer 140 and the coefficient of thermal expansion of the deposition by-product layer 15, it is possible to minimize thermal stress received by the deposition by-product layer 15 due to the difference in the coefficient of thermal expansion.

In addition, the adhesion layer 140 may have a lower elastic modulus (e.g. Young's modulus) than the deposition by-product layer 15. In relation to the deposition by-product layer 15, cracks and/or delamination occur due to tensile and/or shrinking forces (or compressive forces) acting on the deposition by-product layer 15 due to thermal stress or the like, as shown in FIGS. 2(c) and 2(d). Since the tensile force and shrinking force generated by the stress are proportional to the elastic modulus of the material, as the elastic modulus is higher, it can be easily delaminated. Accordingly, the adhesion layer 140 has a lower elastic modulus than the deposition by-product layer 15 so that it is possible to suppress or prevent delamination from the inner wall of the reaction tube 110 rather than the deposition by-product layer 15.

The reaction tube 110 may be made of quartz, and the deposition by-product layer 15 may be a nitride layer. The reaction tube 110 is generally made of quartz ($SiO_2$), and can be used by coating the adhesion layer 140 on the reaction tube 110 that is used (or generally).

The reaction tube 110 is oxide, but depending on the thin film to be deposited on the substrate 10, the deposition by-product layer 15 may be a nitride layer. Since oxide and nitride have different physical properties, when a nitride layer (i.e., deposition by-product) is directly deposited on (or attached to) an oxide (i.e., the reaction tube), the bonding force between oxide (layer) and nitride (layer) is inevitably weak. In addition, since the oxide (layer) has a low coefficient of thermal expansion, but the nitride (layer) has a high coefficient of thermal expansion, the difference in the coefficient of thermal expansion between oxides (layers) and nitrides (layers) is also large, so that delamination of the nitride layer can easily occur. For example, the deposition by-product layer 15 may be a titanium nitride (TiN) layer, and the coefficient of thermal expansion of titanium nitride (TiN) is about $9.4 \times 10^{-6} K^{-1}$, which is much higher than the reaction tube 110 of quartz ($SiO_2$) having a coefficient of thermal expansion of about $0.4 \times 10^{-6} K^{-1}$, so that the difference of the coefficient of thermal expansion of the deposition by-product layer 15 and the coefficient of thermal expansion of the reaction tube 110 is large.

And, the adhesion layer 140 may include an oxide layer 141 formed in contact with the reaction tube 110; and an oxynitride layer 142 formed on the oxide layer 141 and providing an attachment surface of the deposition by-product layer 15. The oxide layer 141 may be formed in contact with the reaction tube 110, and has properties similar to those of the reaction tube 110, which is an oxide, so that the bonding force with the reaction tube 110 may be excellent. That is, since the oxygen atom O can be shared between the oxide layer 141 and the reaction tube 110, the bonding force between the oxide layer 141 and the reaction tube 110 can be improved.

The oxynitride layer 142 may be formed on the oxide layer 141, and may provide an adhesion surface of the deposition by-product layer 15. Since the oxynitride layer 142 has physical properties between oxide and nitride, oxygen atom O may be shared with the oxide layer 141, and nitrogen atom N may be shared with the deposition by-product layer 15, which is a nitride layer. Accordingly, both the bonding force with the oxide layer 141 and the bonding force with the deposition by-product layer 15 may be excellent.

Through this, the bonding force of the adhesion layer 140 and the deposition by-product layer 15 can be improved, and it is possible to further increase the deposition thickness of the deposition by-product layer 15 where particles begin to be generated.

Here, the oxide layer 141 and the oxynitride layer 142 of the adhesion layer 140 may include the same metal element. That is, the oxide layer 141 and the oxynitride layer 142 may be formed by the same metal element, and one metal element may be oxidized to form the oxide layer 141, and the oxynitride layer 142 may be formed by oxynitride. For example, the oxynitride layer 142 may be formed by performing a nitriding (or nitrogen) treatment on the oxide layer 141 (e.g., ammonia (NH3) treatment), and as the oxide layer 141 reacts with the nitrogen atom N to form the deposition by-product layer 15, the oxynitride layer 142 may be formed on the surface of the oxide layer 141.

The deposition by-product layer 15 may include a transition metal element, and the adhesion layer 140 may include a transition metal element. For example, the deposition by-product layer 15 may include a titanium (Ti) element, and may be any one of a nitride, oxide, carbide, and metal film containing a titanium (Ti) element. In addition, the adhesion layer 140 may include an aluminum (Al) element, and may include at least one of an oxide, oxynitride, nitride, carbide, and metal film containing the aluminum (Al) element. Here, transition metal refers to elements of periods 4 to 7 and groups 3 to 12 in the periodic table. For other elements, the chemical property of the main group element in one period changes greatly as the number of valence electrons changes, but the transition metal (s) show many similarities not only in a given group, but also in the same period. Among them, scandium (Sc) to zinc (Zn), which are the first period (i.e., 4th period) transition metal, are very important metal elements representing other transition metal series. In addition, the transition metal serves as an intermediate step of transitioning to a typical element. Due to this, the transition metal has good bonding force because it is well-bonded with other transition metals and other non-metals but due to the difference in physical properties from the semi-metal, it is difficult to bond so that the bonding force is poor.

And, a post-transition metal is located between transition metal and metalloid, and refers to a metal element in the p-zone of the periodic table (e.g., aluminum (Al), gallium (Ga), indium (In), tin (Sn), thallium (Tl), lead (Pb), bismuth (Bi), and Polonium (Po)). These post-transition metals exhibit better covalent bonds in the stacking structure of particles than other metals. The post-transition metal can form two ions, and the oxide of the post-transition metal (e.g. $Al_2O_3$) reacts with the nitrogen atom N to easily form an oxynitride of the post-transition metal (e.g., $Al_2O_yN_z$). The oxide of the post-transition metal can easily form oxynitride on its surface so that the bonding force between the reaction tube 110, which is an oxide, and the deposition by-product layer 15, which is a nitride layer, can be improved. In addition, since the post-transition metal has physical properties between transition metal and metalloid, the bonding force between the reaction tube 110 containing a metalloid element (e.g., Si) and the deposition by-product layer 15 containing a transition metal element (e.g., Ti) can be further improved.

For example, when forming a titanium nitride (TiN) thin film in a typical reaction tube 110 made of quartz ($SiO_2$), aluminum oxide ($Al_2O_3$) and/or aluminum oxynitride ($Al_2O_yN_z$) may be formed as an adhesion layer 140. In this case, aluminum oxide ($Al_2O_3$) not only has excellent adhesion with quartz ($SiO_2$), but also has similar the coefficient of thermal expansion to titanium nitride (TiN) to reduces the thermal stress acting on the titanium nitride (TiN) deposition by-product layer 15 while the adhesion layer 140 adheres well without delamination to the inner wall of the reaction tube 110, so that crack and delamination of the deposition by-product layer 15 can be suppressed or prevented.

The batch-type substrate processing apparatus 100 according to the present invention may further include a cleaning gas supply unit 150 for supplying cleaning gas for removing the deposition by-product layer 15, and the adhesion layer 140 may have higher corrosion resistance to the cleaning gas than the reaction tube 110.

The cleaning gas supply unit 150 may supply cleaning gas for removing the deposition by-product layer 15. Here, the cleaning gas supply unit 150 may include a cleaning gas nozzle 151, a cleaning gas supply pipe 152, and a cleaning gas supply source (not shown). The cleaning gas nozzle 151 can be inserted into the reaction tube 110 and extends vertically along the inner circumferential surface of the reaction tube 110, and may be configured to supply cleaning gas on the adhesion layer 140 coated on the inner wall of the reaction tube 110 from a plurality of cleaning gas injection ports 151a. At this time, a plurality of cleaning gas injection ports 151a may be formed toward the inner wall of the reaction tube 110 to effectively remove the deposition by-product layer 15 attached to the inner wall of the reaction tube 110. Meanwhile, the cleaning gas supply unit 150 may use the deposition gas nozzle 121 as the cleaning gas nozzle 151. At this time, when supplying the cleaning gas or supplying the deposition gas, the deposition gas or the cleaning gas that has been supplied immediately before may be removed from a cleaning gas nozzle (or deposition gas nozzle) through a purge gas.

The cleaning gas supply pipe 152 may deliver (or supply) the cleaning gas to the cleaning gas nozzle 151, and one end may be connected to the cleaning gas nozzle 151, and the other end may be connected to a cleaning gas supply source (not shown).

The cleaning gas supply source (not shown) may be a gas storage source for supplying the cleaning gas to the cleaning gas nozzle 151. Here, depending on the type of deposition by-product layer 15 for cleaning (or removal), a cleaning gas supply source (not shown) may supply a suitable cleaning gas to the cleaning gas nozzle 151, and may supply the cleaning gas to the cleaning gas nozzle 151 through a cleaning gas supply pipe 152.

Here, the adhesion layer 140 may have higher corrosion resistance to the cleaning gas than the reaction tube 110. The adhesion layer 140 may also serve as a protective layer for protecting the reaction tube 110 from the cleaning gas. Conventionally, the reaction tube 110 is also etched by the cleaning gas while removing the deposition by-product layer 15 with the cleaning gas so that there was also a problem that the reaction tube 110 was damaged. Due to this, the life of the reaction tube 110 was inevitably shortened. However, as the adhesion layer 140 is coated on the inner wall of the reaction tube 110, the batch-type substrate processing apparatus 100 of the present invention can prevent the reaction tube 110 from being etched by the cleaning gas and can be used in the long term by extending the life of the reaction tube 110. At this time, the adhesion layer 140 may have a high corrosion resistance to the cleaning gas, and at least may have a higher corrosion resistance than the reaction tube 110. When the adhesion layer 140 is etched, it is necessary to repair the adhesion layer 140 on the inner wall of the reaction tube 110 again. Here, as the adhesion layer 140 has a lower corrosion resistance to the cleaning gas, the period of re-coating the adhesion layer 140 may be shortened, and product productivity may be reduced. Accordingly, the adhesion layer 140 may have a higher corrosion resistance to the cleaning gas than the reaction tube 110 to solve this problem.

For example, titanium nitride (TiN) deposition by-product layer 15 is removed with fluorine (F) gas, and the reaction tube 110 made of quartz (SiO2) may be also etched by fluorine (F) gas. However, when the adhesion layer 140 is coated on the inner wall of the reaction tube 110 with aluminum oxide ($Al_xO_y$), aluminum oxide ($Al_xO_y$) has corrosion resistance to fluorine (F) gas so that etching by fluorine (F) gas can be suppressed or prevented.

The adhesion layer 140 may have a thickness of 0.1 to 100 μm. When the adhesion layer 140 has a thickness less than 0.1 μm, the adhesion layer 140 does not have a sufficient thickness to cause condensation and can be delaminated from the inner wall of the reaction tube 110, and the delaminated adhesion layer 140 can also act as a particle. In addition, the thickness of the adhesion layer 140 is too thin to properly function as a protective layer and the inner wall of the reaction tube 110 is etched by the cleaning gas is exposed to the cleaning gas, so that the reaction tube 110 may be damaged.

On the other hand, when the adhesion layer 140 has a thickness greater than 100 μm, the adhesion layer 140 becomes too thick, and the economic efficiency and productivity of the coating of the adhesion layer 140 may be deteriorated. In addition, it is to give a change point to the designed hardware (HW), such as a change in the gap with the side surface of the substrate 10, so that during the deposition process, side effects may be generated, such as affecting the flow of the deposition gas. Due to this, uniform deposition of a thin film may not be performed on the substrate 10, and thin film characteristics may be deteriorated. In addition, the pitch between the deposition by-product layer 15 attached to the adhesion layer 140 and the substrate boat 115 becomes closer and while lifting the substrate boat 115 in the interior space of the reaction tube 110, the deposition by-product layer 15 may fall off the inner wall of the reaction tube 110. Meanwhile, the adhesion layer 140 may be coated not only on the inner wall of the reaction tube 110, but also on other components such as the deposition gas nozzle 121 and the substrate boat 115 to which the deposition by-product layer 15 can be attached. If the adhesion layer 140 is formed too thickly on the deposition gas nozzle 121, the size of the gas injection port 121a of the deposition gas nozzle 121 is reduced so that the deposition gas is not smoothly supplied on the substrate 10, and the thin film is not uniformly and effectively deposited on the substrate 10.

Accordingly, the adhesion layer 140 may have a thickness of 0.1 to 100 μm, and a deposition by-product layer 15 of 0 to 3 μm thickness may be attached on the adhesion layer 140. At this time, whenever the deposition thickness of the deposition by-product layer 15 becomes greater than or equal to the thickness selected in the range of 303 nm to 3 μm, the deposition by-product layer 15 can be removed. Conventionally, since there is no adhesion layer 140, the deposition by-product layer 15 is directly attached to the inner wall of the reaction tube 110, so that particles were generated even when the deposition thickness of the deposition by-product layer 15 was only 0.3 μm (300 nm). However, in relation to the batch-type substrate processing apparatus 100 of the present invention, the adhesion layer 140 is coated on the inner wall of the reaction tube 110 so that particles may not be generated even if the deposition by-product layer 15 is attached to a thickness of about 3 μm. Accordingly, the in-situ cleaning cycle of the reaction tube 110 can be increased.

Figure 3:
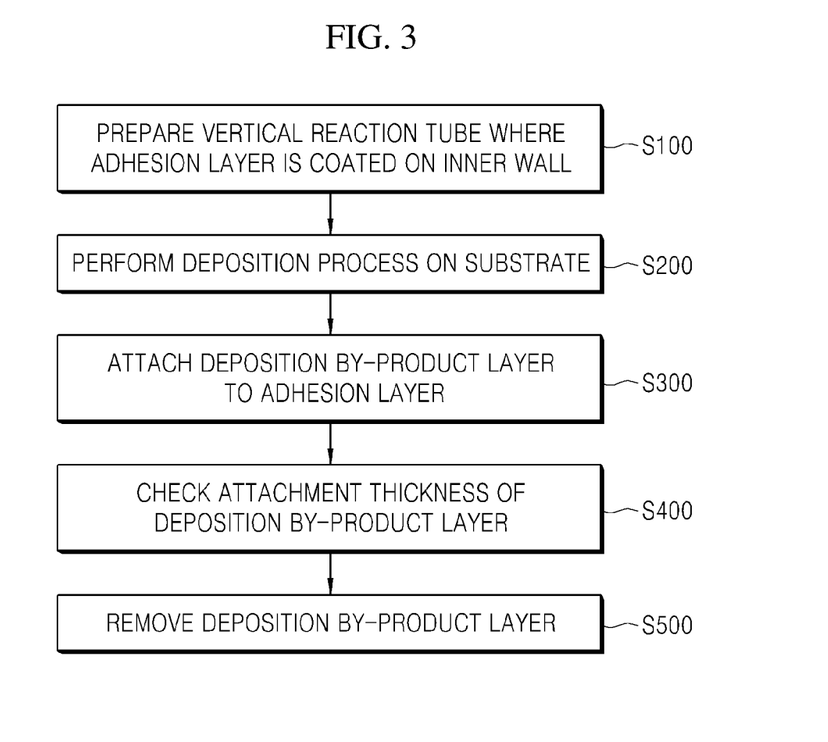
FIG. 3 is a flowchart illustrating an operation method of a batch-type substrate processing apparatus according to another embodiment of the present invention.

FIG. 3 is a flowchart illustrating an operation method of a batch-type substrate processing apparatus according to another embodiment of the present invention.

Looking at the operation method of the batch-type substrate processing apparatus according to another embodiment of the present invention in more detail with reference to FIG. 3, in relation to a batch-type substrate processing apparatus according to an embodiment of the present invention, details that overlap with the above-described parts will be omitted.

A method of operating a batch-type substrate processing apparatus according to another embodiment of the present invention may include preparing a reaction tube of a vertical type coated with an adhesion layer on the inner wall (S100); performing a deposition process for a substrate loaded in multiple stages on a substrate boat by supplying deposition gas to the interior space of the reaction tube (S200); attaching a deposition by-product layer by excess deposition gas to the adhesion layer (S300); confirming the deposition thickness of the deposition by-product layer (S400); and removing the deposition by-product layer when the measured deposition thickness of the deposition by-product layer is greater than or equal to a preset thickness (S500).

First, prepared is a vertical reaction tube coated with an adhesion layer on the inner wall (S100). The reaction tube can be prepared by coating an adhesion layer on the inner wall of a vertical reaction tube. The adhesion layer may coat the adhesion layer by supplying a coating gas for coating of the adhesion layer in the interior space of the reaction tube to the interior space of the reaction tube. At this time, the adhesion layer may be deposited (or coated) by the coating gas sprayed toward the inner wall of the reaction tube. That is, since the adhesion layer is deposited directly on the inner wall of the reaction tube by spraying the coating gas toward the inner wall of the reaction tube, it can be uniformly deposited on the entire surface of the inner wall of the reaction tube with a sufficient thickness at which coalescence occurs. Accordingly, the intrinsic stress of the adhesion layer may be reduced, and the bonding force with the reaction tube may be improved, and the influence of thermal stress due to a difference in the coefficient of thermal expansion with the reaction tube may be reduced. Here, the adhesion layer can be deposited in various ways, such as Plasma-Enhanced Atomic Layer Deposition (PE-ALD), Thermal Atomic Layer Deposition (thermal ALD), Chemical Vapor Deposition (CVD), Physical Vapor Deposition; PVD), and the like At this time, after coating the adhesion layer on the inner wall of the reaction tube in a separate facility other than the batch-type substrate processing apparatus where the deposition process is performed, it can also be installed on the batch-type substrate processing apparatus.

On the other hand, the adhesion layer may be provided inside the batch-type substrate processing apparatus, such as the outer wall of a reaction tube, a substrate boat, a pedestal, and the inside and outside surfaces of deposition gas nozzles, and also may be coated on other components affected by deposition gas.

Next, the deposition gas is supplied to the interior space of the reaction tube and a deposition process is performed for the substrate loaded in multiple stages on the substrate boat (S200). A thin film can be deposited on the substrate by supplying a deposition gas to the interior space of the reaction tube. At this time, by the excess deposition gas deposited on the substrate and remaining, a deposition by-product layer made of the same component as the thin film may be deposited (or attached) on the inner wall of the reaction tube.

Then, a deposition by-product layer by excess deposition gas is attached to the adhesion layer (S300). While performing the deposition process, a deposition by-product layer by excess deposition gas may be attached (or deposited) on the adhesion layer. Here, the deposition by-product layer is not directly attached to the inner wall of the reaction tube, but is attached to the adhesion layer. Accordingly, the deposition thickness of the deposition by-product layer where particles begin to be generated may increase compared to when the deposition by-product layer is directly attached to the inner wall surface of the reaction tube.

Then, the deposition thickness of the deposition by-product layer is checked (S400). By checking (or monitoring) the deposition thickness of the deposition by-product layer, the removal time of the deposition by-product layer can be determined. The deposition thickness of the deposition by-product layer can be measured, or can be measured directly, and the deposition thickness of the deposition by-product layer per deposition (process) may be grasped (or calculated) in advance and calculated indirectly according to the number of depositions. Here, the number of depositions may be the number of deposition processes performed while replacing with a new substrate. In this case, the number of depositions may be the same as the number of substrate sets on which the thin film is deposited, and the substrate set may be a bundle (or number) of substrates loaded on the substrate boat and loaded into the reaction tube in one deposition process.

Then, when the measured deposition thickness of the deposition by-product layer is greater than or equal to a preset thickness, the deposition by-product layer is removed (S500). When it is greater than the measured adhesion thickness of the deposition by-product layer, in order to prevent the deposition by-product layer from being delaminated and prevent particles from falling onto the substrate, the deposition by-product layer can be removed.

The process S200 of performing the deposition process and the process S300 of attaching the deposition by-product layer may be performed repeatedly. The process S200 of performing the deposition process and the process S300 of attaching the deposition by-product layer are performed repeatedly, so that the deposition thickness of the deposition by-product layer may increase, and when the deposition thickness of the deposition by-product layer exceeds the preset thickness, the deposition by-product layer can be removed. At this time, the process of checking the deposition thickness of the deposition by-product layer S400 may be repeatedly performed after the process of attaching the deposition by-product layer S300. Also, it may be performed from when the process S200 of performing the deposition process and the process S300 of attaching the deposition by-product layer are performed two or more times. Here, the process S500 of removing the deposition by-product layer may be performed after the process S200 of performing the deposition process and the process S300 of attaching the deposition by-product layer are repeatedly performed multiple times (or two or more times).

The reaction tube may be made of quartz, and the deposition by-product layer may be a nitride layer. The reaction tube is generally made of quartz ($SiO2$), and can be used by coating the adhesion layer on the reaction tube that is used (or generally).

While the reaction tube is an oxide, the deposition by-product layer may be a nitride layer depending on the thin film to be deposited on the substrate. Since oxide and nitride have different physical properties, when a nitride layer (i.e., deposition by-product) is directly deposited on (or attached to) an oxide (i.e., the reaction tube), the bonding force between oxide (layer) and nitride (layer) is inevitably weak. In addition, since the oxide (layer) has a low coefficient of thermal expansion, but the nitride (layer) has a high coefficient of thermal expansion, the difference in the coefficient of thermal expansion between oxides (layers) and nitrides (layers) is also large, so that delamination of the nitride layer can easily occur. For example, the deposition by-product layer may be a titanium nitride (TiN) layer, and the coefficient of thermal expansion of titanium nitride (TiN) is about $9.4\times10^{-6}K^{-1}$, which is much higher than the reaction tube of quartz ($SiO_2$) having a coefficient of thermal expansion of about $0.4\times10^{-6}K^{-1}$, so that the difference of the coefficient of thermal expansion of the deposition by-product layer and the coefficient of thermal expansion of the reaction tube is large.

And the process S100 of preparing the reaction tube may include a process S100 of forming an oxide layer on the inner wall of the reaction tube and a process S120 of forming an oxynitride layer on the oxide layer.

An oxide layer may be formed on the inner wall of the reaction tube (S110). An oxide layer may be formed on the inner wall of the reaction tube in contact with the reaction tube. The oxide layer may be formed in contact with the reaction tube, and has properties similar to those of the reaction tube, which is an oxide, so that the bonding force with the reaction tube may be excellent. That is, since the oxygen atom (O) can be shared between the oxide layer and the reaction tube, the bonding force between the oxide layer and the reaction tube can be improved.

In addition, an oxynitride layer may be formed on the oxide layer (S120). The oxynitride layer may be formed on the surface of the adhesion layer, and may be formed on the surface of the adhesion layer to provide an adhesion surface of the deposition by-product layer. Since the oxynitride layer has physical properties between oxide and nitride, oxygen atom O may be shared with the oxide layer, and nitrogen atom N may be shared with the deposition by-product layer, which is a nitride layer. Accordingly, both the bonding force with the oxide layer and the bonding force with the deposition by-product layer may be excellent.

Through this, the bonding force of the adhesion layer and the deposition by-product layer can be improved, and it is possible to further increase the deposition thickness of the deposition by-product layer where particles begin to be generated.

Here, the oxide layer and the oxynitride layer of the adhesion layer may include the same metal element. That is, the oxide layer and the oxynitride layer may be formed by the same metal element, and one metal element may be oxidized to form the oxide layer, and the oxynitride layer may be formed by oxynitride. For example, the oxynitride layer may be formed by performing a nitriding (or nitrogen) treatment on the oxide layer (e g, ammonia (NH3) treatment), and as the oxide layer reacts with the nitrogen atom N to form the deposition by-product layer, the oxynitride layer may be formed on the surface of the oxide layer.

The thickness of the adhesion layer may be 0.1 to 100 μm, and the process S500 of removing the deposition by-product layer may be performed when the deposition thickness of the deposition by-product layer is 303 nm or more. When the adhesion layer has a thickness less than 0.1 μm, the adhesion layer does not have a sufficient thickness to cause condensation and can be delaminated from the inner wall of the reaction tube, and the delaminated adhesion layer can also act as a particle. In addition, the thickness of the adhesion layer is too thin to properly function as a protective layer and the inner wall of the reaction tube is etched by the cleaning gas is exposed to the cleaning gas, so that the reaction tube may be damaged.

On the other hand, when the adhesion layer has a thickness greater than 100 μm, the adhesion layer becomes too thick, and the economic efficiency and productivity of the coating of the adhesion layer may be deteriorated. In addition, it is to give a change point to the designed hardware (HW), such as a change in the gap with the side surface of the substrate, so that during the deposition process, side effects may be generated, such as affecting the flow of the deposition gas. Due to this, uniform deposition of a thin film may not be performed on the substrate, and thin film characteristics may be deteriorated. In addition, the pitch between the deposition by-product layer attached to the adhesion layer and the substrate boat becomes closer and while lifting the substrate boat in the interior space of the reaction tube, the deposition by-product layer may fall off the inner wall of the reaction tube due to vibration. Meanwhile, the adhesion layer may be coated not only on the inner wall of the reaction tube, but also on other components such as the deposition gas nozzle and the substrate boat to which the deposition by-product layer can be attached. If the adhesion layer is formed too thickly on the deposition gas nozzle, the size of the gas injection port of the deposition gas nozzle is reduced so that the deposition gas is not smoothly supplied on the substrate, and the thin film is not uniformly and effectively deposited on the substrate.

Accordingly, the adhesion layer may have a thickness of 0.1 to 100 μm, and the process S500 of removing the deposition by-product layer may be performed when the deposition thickness of the deposition by-product layer is 303 nm or more. At this time, whenever the deposition thickness of the deposition by-product layer becomes greater than or equal to the thickness selected in the range of 303 nm to 3 µm, the deposition by-product layer can be removed. Conventionally, since there is no adhesion layer, the deposition by-product layer is directly attached to the inner wall of the reaction tube, so that particles were generated even when the deposition thickness of the deposition by-product layer was only 0.3 µm (300 nm). However, in the present invention, the adhesion layer is coated on the inner wall of the reaction tube so that particles may not be generated even if the deposition by-product layer is attached to a thickness of about 3 µm. Accordingly, when the deposition thickness of the deposition by-product layer is 3 µm or more, a process S500 of removing the deposition by-product layer may be performed, and the in-situ cleaning cycle of the reaction tube can be increased.

For example, the deposition by-product layer of at least 30 Å (3 nm) may be attached to the inner wall of the chamber (i.e., the adhesion layer) through one deposition process. In the present invention, after performing the deposition process (i.e., when the deposition thickness of the deposition by-product layer is 303 nm or more) at least one or more times than the conventional case where particles are generated even when the deposition thickness of the deposition by-product layer is 0.3 µm, in-situ cleaning of the reaction tube to remove the deposition by-product layer may be performed.

The operation method of the batch-type substrate processing apparatus according to the present invention may further include a process S250 of providing thermal energy inside the reaction tube, and the adhesion layer may have a coefficient of thermal expansion between the coefficient of thermal expansion of the reaction tube and the coefficient of thermal expansion of the deposition by-product layer.

And it is possible to provide thermal energy to the interior of the reaction tube (S250). Through the heater provided along the periphery of the reaction tube on the outside of the reaction tube, thermal energy may be provided to the inside of the reaction tube through the sidewall of the reaction tube from the outside of the reaction tube. The process S250 of providing thermal energy inside the reaction tube may be performed simultaneously with the process S200 of performing the deposition process and through the process S250 of providing thermal energy to the interior of the reaction tube, a thin film may be deposited on the substrate while heating the substrate. At this time, due to the heat treatment of the substrate for thin film deposition and cooling of the reaction tube for carrying out the substrate, the deposition by-product layer has no choice but to be exposed to continuous thermal changes. Accordingly, cracks and/or delamination occurs in the deposition by-product layer due to thermal stress so that small particles of the delamination deposited by-product layer fall off the inner wall of the reaction tube. When the small particles of the by-product layer fall on the substrate, this can act as a particle and degrade the properties and/or yield of products including thin films. In particular, since it provides thermal energy to the inside of the reaction tube outside the reaction tube, the inner wall of the reaction tube is close to a heat source (i.e., the heater), which is forced to be sensitive to heat changes, and the deposition by-product layer attached to the inner wall of the reaction tube has a severe (or large) thermal stress.

The adhesion layer may have a coefficient of thermal expansion between the coefficient of thermal expansion of the reaction tube and the coefficient of thermal expansion of the deposition by-product layer. The thermal stress received by the deposition by-product layer attached on the inner wall of the reaction tube is generated in proportion to the difference in the coefficient of thermal expansion from the substrate (or the structure providing the attachment surface) to which the deposition by-product layer is attached. Accordingly, the adhesion layer having a coefficient of thermal expansion between the coefficient of thermal expansion of the reaction tube and the coefficient of thermal expansion of the deposition by-product layer reduces the difference in the coefficient of thermal expansion from the deposition by-product layer so that it is possible to reduce the thermal stress received by the deposition by-product layer.

In addition, the adhesion layer may have a lower elastic modulus (e.g. Young's modulus) than the deposition by-product layer. In relation to the deposition by-product layer, cracks and/or delamination occur due to tensile and/or shrinking forces (or compressive forces) acting on the deposition by-product layer due to thermal stress or the like. Since the tensile force and shrinking force generated by the stress are proportional to the elastic modulus of the material, as the elastic modulus is higher, it can be easily delaminated. Accordingly, the adhesion layer has a lower elastic modulus than the deposition by-product layer so that it is possible to suppress or prevent delamination from the inner wall of the reaction tube rather than the deposition by-product layer.

The process S500 of removing the deposition by-product layer may include a process S510 of supplying a cleaning gas for removing the deposition by-product layer, and the adhesion layer may have a higher corrosion resistance to the cleaning gas than the reaction tube.

A cleaning gas for removing the deposition by-product layer may be supplied (S510). The deposition by-product layer attached to the inner wall of the reaction tube can be removed by supplying the cleaning gas to the interior space of the reaction tube, and by removing the deposition by-product layer, it is possible to prevent the deposition by-product layer from being delaminated and acting as a particle.

Here, the adhesion layer may have higher corrosion resistance to the cleaning gas than the reaction tube. The adhesion layer may also serve as a protective layer for protecting the reaction tube from the cleaning gas. Conventionally, the reaction tube is also etched by the cleaning gas while removing the deposition by-product layer with the cleaning gas so that there was also a problem that the reaction tube was damaged and because of this, the life of the reaction tube had to be shortened. However, as the adhesion layer is coated on the inner wall of the reaction tube, the present invention can prevent the reaction tube from being etched by the cleaning gas and can be used in the long term by extending the life of the reaction tube. At this time, the adhesion layer may have a high corrosion resistance to the cleaning gas, and at least may have a higher corrosion resistance than the reaction tube. When the adhesion layer is etched, it is necessary to repair the adhesion layer on the inner wall of the reaction tube again, and as the corrosion resistance of the adhesion layer to the cleaning gas is lower, the cycle for recoating the adhesion layer may be shortened, and product productivity may be reduced. Accordingly, the adhesion layer may have a higher corrosion resistance to the cleaning gas than the reaction tube to solve this problem.

In such a way, according to the present invention, by coating an adhesion layer on the inner wall of the reaction tube to induce deposition by-product layer by excess deposition gas to adhere to the surface of the adhesion layer, the deposition thickness at which particles begin to be generated may be further increased compared to when the deposition by-product layer is directly attached to the inner wall surface of the reaction tube. Accordingly, the in-situ cleaning cycle of the reaction tube can be increased, and a large number of deposition processes can be performed without a cleaning process, thereby increasing product productivity. In addition, as forming an oxynitride layer on the surface of the adhesion layer when the deposition process of the nitride thin film is performed, by increasing the bonding force between the deposition by-product layer and the adhesion layer, which is a nitride, it is possible to further increase the adhesion thickness at which particles are generated. And, by coating the inner wall of the reaction tube with an adhesion layer that has higher corrosion resistance than the reaction tube for cleaning gas, it is possible to suppress or prevent the reaction tube from being etched and damaged, so that long-term use of the reaction tube can be made possible.

In such a way, in relation to the batch-type substrate processing apparatus according to an embodiment of the present invention, by coating an adhesion layer on the inner wall of the reaction tube to induce deposition by-product layer by excess deposition gas to adhere to the surface of the adhesion layer, the deposition thickness at which particles begin to be generated may be further increased compared to when the deposition by-product layer is directly attached to the inner wall surface of the reaction tube. Accordingly, the in-situ cleaning cycle of the reaction tube can be increased and a large number of deposition processes can be performed without removing (or cleaning) the process of removing the deposition by-product layer so that product productivity can be increased.

In addition, as forming an oxynitride layer on the surface of the adhesion layer when the deposition process of the nitride thin film is performed, by increasing the bonding force between the deposition by-product layer and the adhesion layer, which is a nitride, it is possible to further increase the adhesion thickness at which particles are generated.

And, by coating the inner wall of the reaction tube with an adhesion layer that has higher corrosion resistance than the reaction tube for cleaning gas, it is possible to suppress or prevent the reaction tube from being etched and damaged, so that long-term use of the reaction tube can be made possible.

Although the batch-type substrate processing apparatus and its operating method have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A batch-type substrate processing apparatus comprising:
   a vertical reaction tube having an internal space for receiving a substrate boat in which a substrate is stacked in multiple stages;
   a deposition gas supply unit configured to supply a deposition gas inside the reaction tube;
   a heater disposed outside the reaction tube to provide a thermal energy inside the reaction tube; and
   an adhesion layer coated on an inner wall of the reaction tube and to which a deposition by-product layer by an excess deposition gas is attached.

2. The substrate processing apparatus of claim 1, wherein The adhesion layer has a coefficient of thermal expansion between a coefficient of thermal expansion of the reaction tube and a coefficient of thermal expansion of the deposition by-product layer.

3. The substrate processing apparatus of claim 2, wherein a difference of the coefficient of thermal expansion of the adhesion layer and the coefficient of thermal expansion of the deposition by-product layer is smaller than a difference of the coefficient of thermal expansion of the adhesion layer and the coefficient of thermal expansion of the reaction tube.

4. The substrate processing apparatus of claim 1, wherein the adhesion layer has an elastic modulus lower than the deposition by-product layer.

5. The substrate processing apparatus of claim 1, wherein the reaction tube is made of quartz,
   wherein the deposition by-product layer is a nitride layer,
   wherein the adhesion layer comprises:
   an oxide layer formed in contact with the reaction tube; and
   an oxynitride layer formed on the oxide layer to provide an attachment surface of the deposition by-product layer.

6. The substrate processing apparatus of claim 5, wherein the oxide layer and the oxynitride layer of the adhesion layer comprise the same metal element.

7. The substrate processing apparatus of claim 1, wherein the deposition by-product layer comprises a transition metal element, and wherein the adhesion layer comprises a post-transition metal element.

8. The substrate processing apparatus of claim 1, further comprising a cleaning gas supply unit configured to supply a cleaning gas for removing the deposition by-product layer, and
   wherein the adhesion layer has a higher corrosion resistance to the cleaning gas than the reaction tube.

9. The substrate processing apparatus of claim 1, wherein the adhesion layer has a thickness of 0.1 μm to 100 μm.

* * * * *